United States Patent
Nakajima et al.

(10) Patent No.: US 9,543,321 B1
(45) Date of Patent: Jan. 10, 2017

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Kazuaki Nakajima, Yokkaichi (JP); Seiichi Omoto, Yokkaichi (JP); Hiroshi Toyoda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/991,084

(22) Filed: Jan. 8, 2016

Related U.S. Application Data

(60) Provisional application No. 62/196,003, filed on Jul. 23, 2015.

(51) Int. Cl.
| | | |
|---|---|---|
| *H01L 27/11* | (2006.01) | |
| *H01L 27/115* | (2006.01) | |
| *H01L 29/792* | (2006.01) | |
| *H01L 29/66* | (2006.01) | |
| *H01L 21/311* | (2006.01) | |
| *H01L 21/28* | (2006.01) | |

(52) U.S. Cl.
CPC ... *H01L 27/11582* (2013.01); *H01L 21/28282* (2013.01); *H01L 21/31116* (2013.01); *H01L 27/11565* (2013.01); *H01L 27/11568* (2013.01); *H01L 29/66833* (2013.01); *H01L 29/792* (2013.01)

(58) Field of Classification Search
CPC ............. H01L 29/792; H01L 27/11563; H01L 29/4234; H01L 29/66833
See application file for complete search history.

(56) References Cited

U.S. PATENT DOCUMENTS

| | | |
|---|---|---|
| 2013/0161629 A1 | 6/2013 | Han et al. |
| 2015/0008506 A1 | 1/2015 | Yang et al. |
| 2015/0249010 A1 | 9/2015 | Kubota |
| 2016/0141419 A1* | 5/2016 | Baenninger ....... H01L 27/11524 257/314 |

* cited by examiner

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

A semiconductor memory device according to an embodiment comprises a stacked body, a semiconductor layer, a charge accumulation layer, and a slit portion. The stacked body includes a plurality of control gate electrodes stacked above a substrate. The semiconductor layer has one end thereof connected to the substrate, and faces the plurality of control gate electrodes. The charge accumulation layer is positioned between the control gate electrode and the semiconductor layer. The slit portion extends in a direction of the substrate from a surface of the stacked body, wherein the slit portion has its longitudinal direction in a direction intersecting the first direction.

18 Claims, 15 Drawing Sheets

SEMICONDUCTOR MEMORY DEVICE AND METHOD OF MANUFACTURING THE SAME

CROSS REFERENCE TO RELATED APPLICATIONS

This application is based on and claims the benefit of priority from prior U.S. Provisional Patent Application No. 62/196,003, filed on Jul. 23, 2015, the entire contents of which are incorporated herein by reference.

BACKGROUND

Field

Embodiments described herein relate to a semiconductor memory device and a method of manufacturing the same.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

In such a three-dimensionally structured semiconductor memory device, there is a problem that as a stacking number increases, warping of a substrate occurs due to stress of stacked films.

DETAILED DESCRIPTION

A semiconductor memory device according to an embodiment comprises a plurality of stacked bodies, a semiconductor layer, a charge accumulation layer, and a slit portion. The plurality of stacked bodies include a plurality of control gate electrodes stacked above a substrate, have their longitudinal direction in a first direction parallel to the substrate, and are arranged in a second direction intersecting the first direction. The semiconductor layer has one end thereof connected to the substrate, and faces the plurality of control gate electrodes. The charge accumulation layer is positioned between the control gate electrode and the semiconductor layer. The slit portion extends in a direction of the substrate from a surface of the stacked body, wherein the slit portion has its longitudinal direction in a direction intersecting the first direction.

Next, nonvolatile semiconductor memory devices according to embodiments will be described in detail with reference to the drawings. Note that these embodiments are merely examples, and are not shown with the intention of limiting the present invention. Moreover, each of the drawings of the nonvolatile semiconductor memory devices employed in the embodiments below is schematic, and thicknesses, widths, ratios, and so on, of layers are different from those of the actual nonvolatile semiconductor memory devices.

The embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor layer acting as a channel provided in a column shape perpendicularly to a substrate; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell.

First Embodiment

Semiconductor Memory Device

Figure 1:
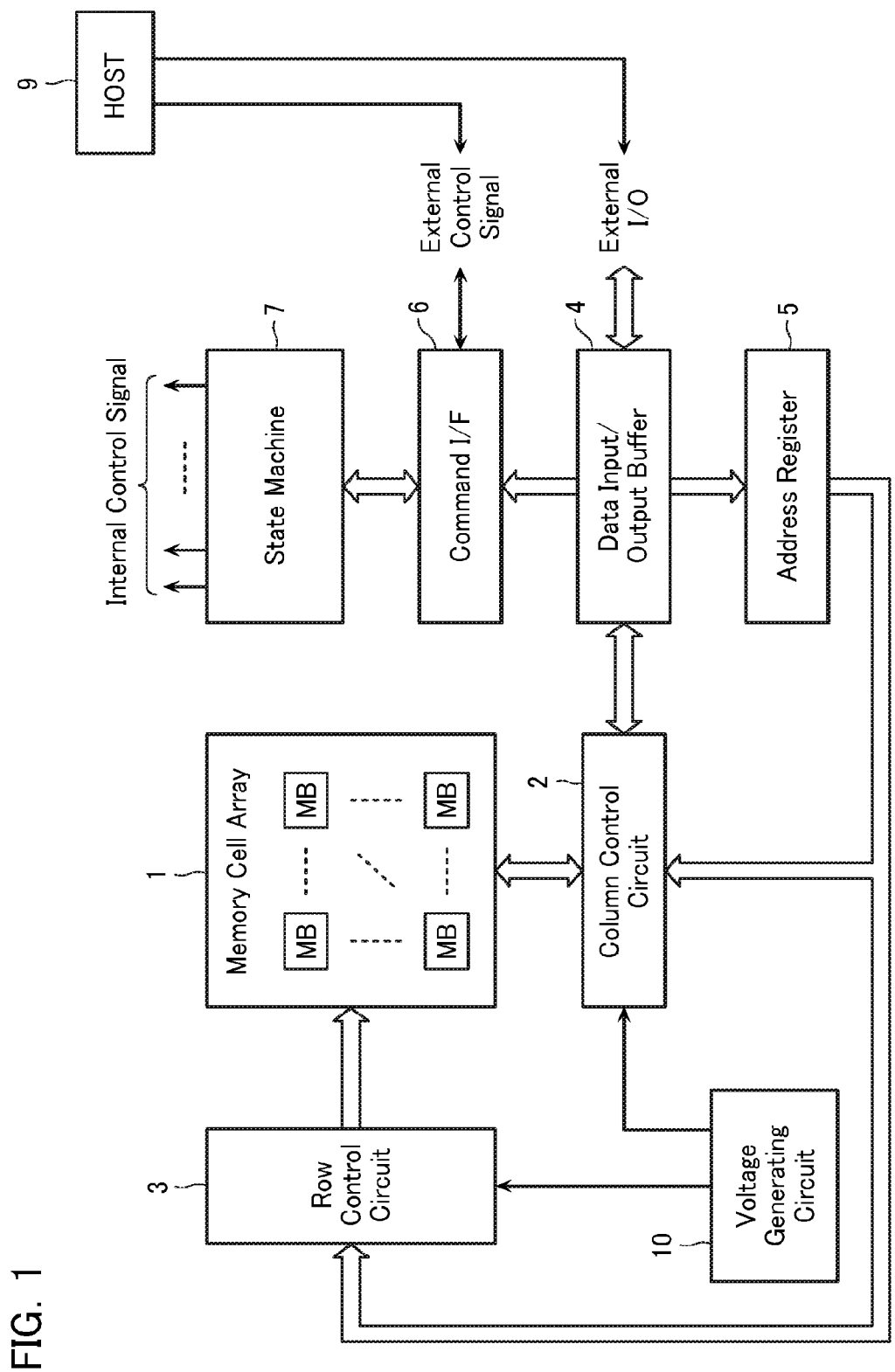
FIG. 1 is a block diagram of a nonvolatile semiconductor memory device according to a first embodiment.

FIG. 1 is a block diagram of a nonvolatile semiconductor memory device according to a first embodiment. The nonvolatile semiconductor memory device of the first embodiment stores write data inputted from an external host 9, in a certain address in a memory cell array 1. In addition, the nonvolatile semiconductor memory device of the first embodiment reads data from a certain address in the memory cell array 1, and outputs the data to the external host 9.

That is, as shown in FIG. 1, the nonvolatile semiconductor memory device of the first embodiment comprises the memory cell array 1 that stores data. The memory cell array 1 comprises a plurality of memory blocks MB. As will be described later with reference to FIG. 2, these memory blocks MB each comprise: a plurality of memory cells MC; and a bit line BL and a word line WL connected to these memory cells MC.

As shown in FIG. 1, the nonvolatile semiconductor memory device of the first embodiment comprises a column control circuit 2 provided in a periphery of the memory cell array 1. The column control circuit 2 transfers a voltage generated by a voltage generating circuit 10 to a desired bit line BL according to inputted data. Moreover, the column control circuit 2 comprises an unillustrated sense amplifier, and detects a voltage or potential of a certain bit line BL.

As shown in FIG. 1, the nonvolatile semiconductor memory device of the first embodiment comprises a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the nonvolatile semiconductor memory device of the first embodiment comprises an address register 5 that supplies address data to the column control circuit 2 and the row control circuit 3. The address register 5 stores address data inputted from a data input/output buffer 4.

As shown in FIG. 1, the nonvolatile semiconductor memory device of the first embodiment comprises the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the nonvolatile semiconductor memory device of the first embodiment comprises the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the nonvolatile semiconductor memory device of the first embodiment comprises the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the nonvolatile semiconductor memory device of the first embodiment comprises the command interface 6 that receives an external control signal from the external host 9. The command interface 6 determines which of write data, command data, and address data data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
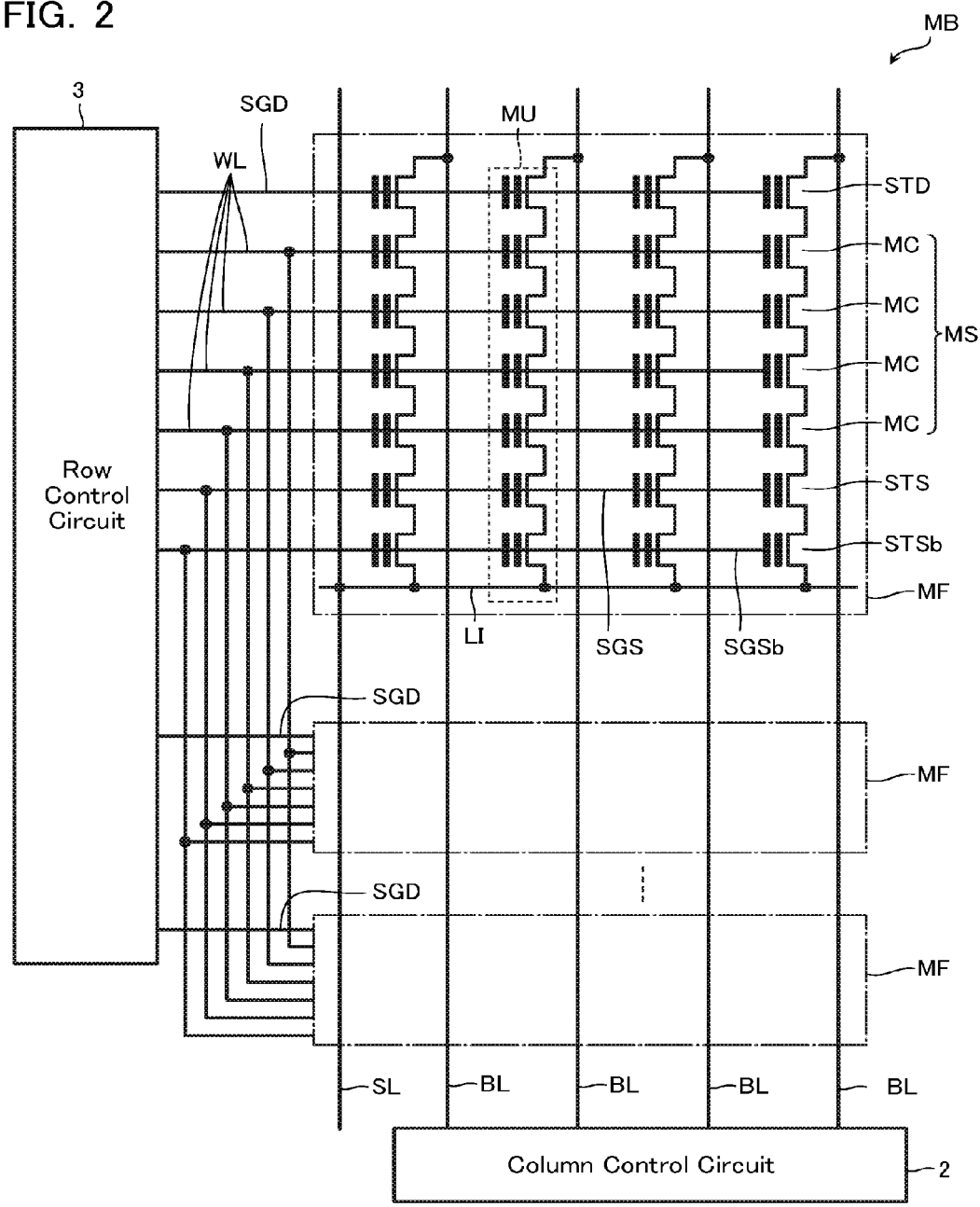
FIG. 2 is a circuit diagram showing a configuration of part of the nonvolatile semiconductor memory device according to the first embodiment.

Next, a circuit configuration of part of the memory cell array 1 according to the present embodiment will be described with reference to FIG. 2. FIG. 2 is an equivalent circuit diagram showing a configuration of the memory block MB configuring the memory cell array 1. In the memory block MB shown in FIG. 2, a certain drain side select gate line SGD and a certain word line WL are selected by the row control circuit 3, whereby a certain number of memory cells MC are selected. Moreover, data of the memory cells MC connected to a certain number of bit lines BL is read by the column control circuit 2.

As shown in FIG. 2, the memory blocks MB each comprise a plurality of memory fingers MF. Commonly connected to these pluralities of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF comprises a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU comprises a plurality of the memory cells MC connected in series. As will be mentioned later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of memory cells MC connected in series will be called a "memory string MS". The row control circuit 3 transfers a voltage to a certain word line WL, thereby transferring this voltage to the control gate of a certain memory cell MC in the memory string MS.

As shown in FIG. 2, commonly connected to the control gates of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU comprises a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby connecting all of the memory strings MS in a certain memory finger MF to the bit lines BL.

Moreover, as shown in FIG. 2, the memory unit MU comprises a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Figure 3:
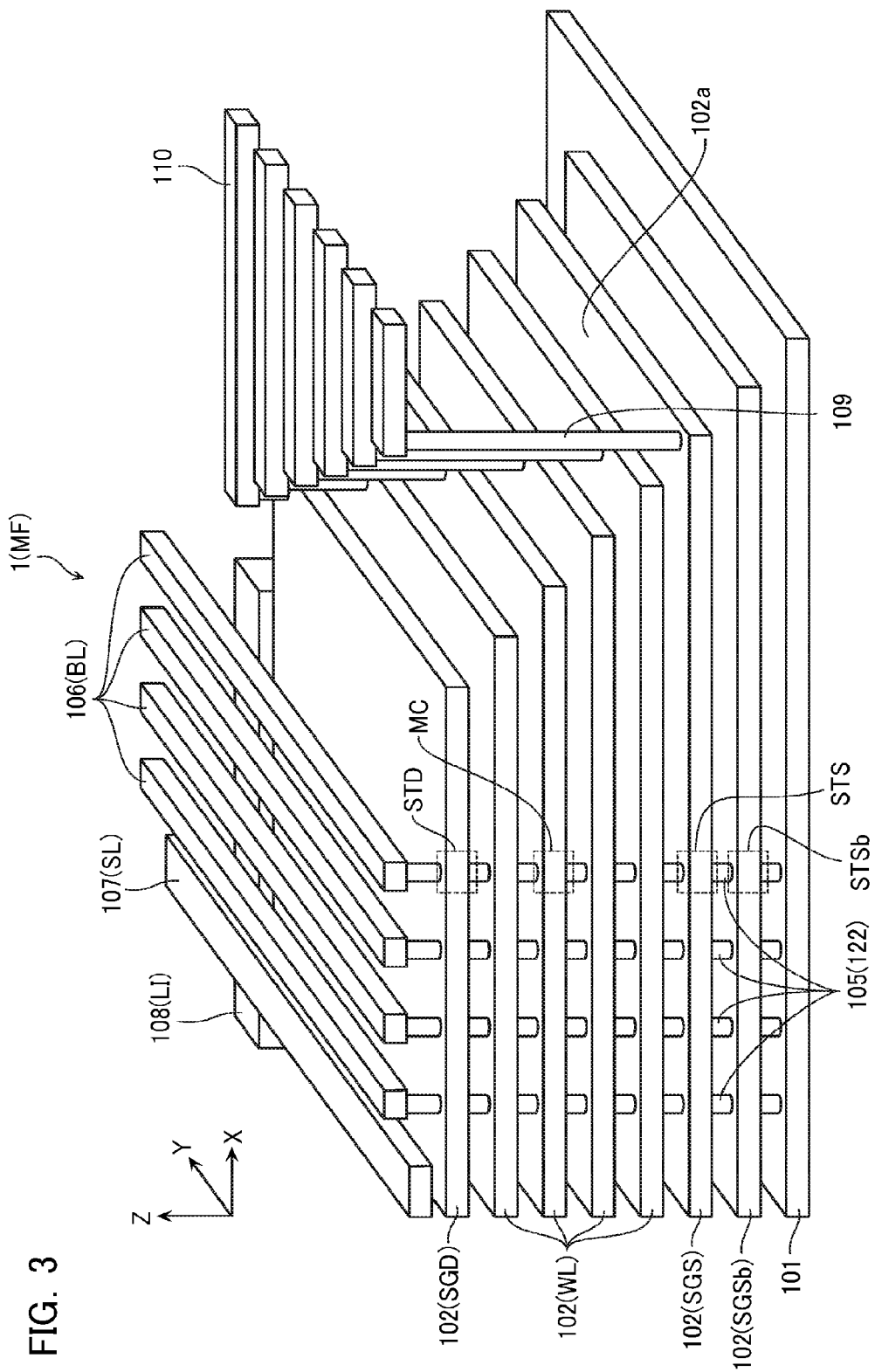
FIG. 3 is a perspective view showing a configuration of part of the nonvolatile semiconductor memory device according to the first embodiment.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF comprises: a substrate 101; and a plurality of conductive layers 102 stacked in a Z direction above the substrate 101. Although illustration thereof is omitted in FIG. 3, an inter-layer insulating layer is provided between the plurality of conductive layers 102.

In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a metal film of the likes of tungsten (W), for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

In addition, as shown in FIG. 3, the memory finger MF comprises a conductive layer 108. The conductive layer 108 faces side surfaces in a Y direction of the plurality of conductive layers 102, and has a plate-like shape extending in an X direction and the Z direction. Moreover, the conductive layer 108 has a plate-like shape having the X direction as its longitudinal direction. A lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF comprises a plurality of conductive layers 106 and a conductive layer 107 that are positioned above the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

Moreover, parts of ends of the plurality of conductive layers 102 are formed in steps as shown in FIG. 3, and are connected at their upper surfaces to an upper layer wiring line 110 via a contact 109. The plurality of conductive layers 102 are connected to an external circuit (row control circuit 3) via this contact 109 and the upper layer wiring line 110, and are provided with a required voltage by the external circuit.

In this way, the nonvolatile semiconductor memory device of the first embodiment includes a stacked body of the conductive layers 102 and inter-layer insulating layers, and this conductive layer 102 is formed from a metal film of tungsten, or the like. In this case, there is a risk that in a deposition process of the metal film, a tensile stress occurs in the metal film, whereby warping occurs in the substrate, and so on. In order to suppress such warping, the nonvolatile semiconductor memory device of the first embodiment comprises a configuration (through hole H1) described in FIG. 5 and subsequent drawings.

Figure 4:
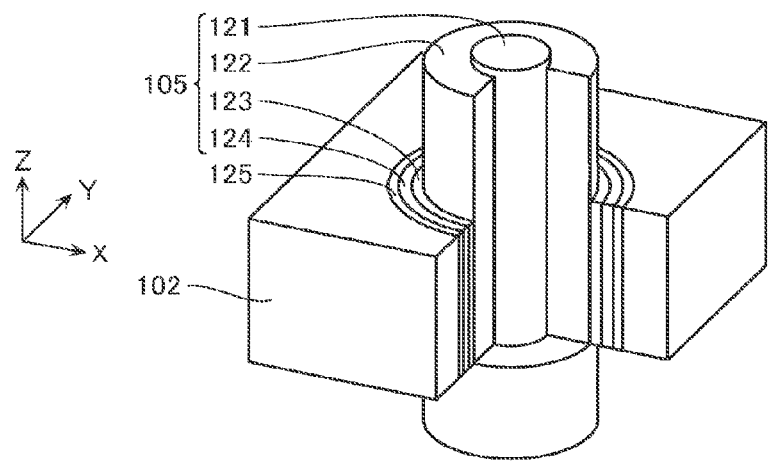
FIG. 4 is a perspective view showing a configuration of part of the nonvolatile semiconductor memory device according to the first embodiment.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises the following, sequentially from its center side toward its outer side, namely: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the lowermost layer source side select gate transistor STSb, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide ($SiO_2$), for example.

Figure 5:
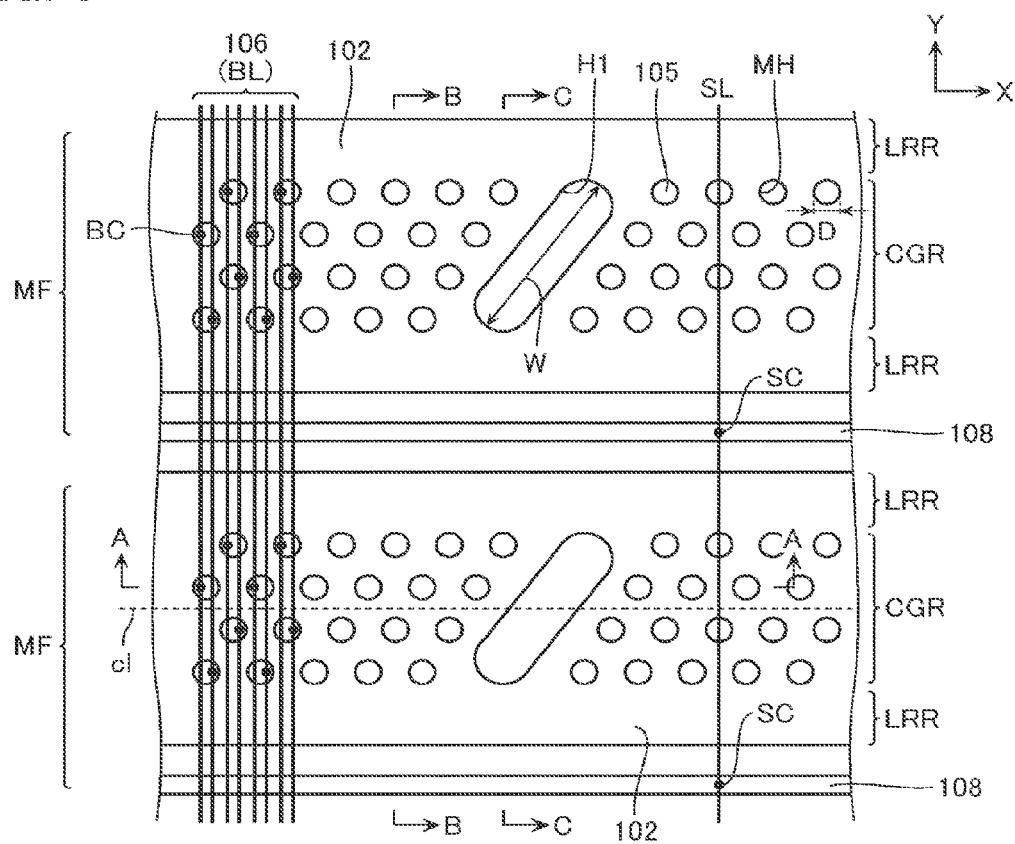
FIG. 5 is a plan view showing a configuration of part of the nonvolatile semiconductor memory device according to the first embodiment.
Figure 6:
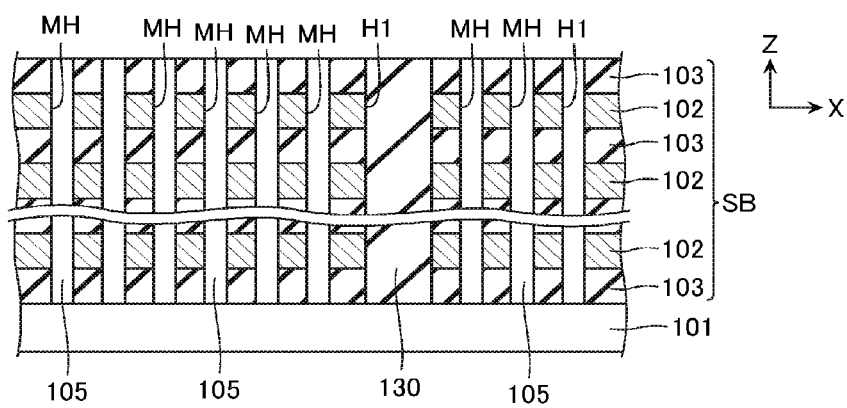
FIG. 6 is a cross-sectional view showing a configuration of part of the nonvolatile semiconductor memory device according to the first embodiment.
Figure 7:
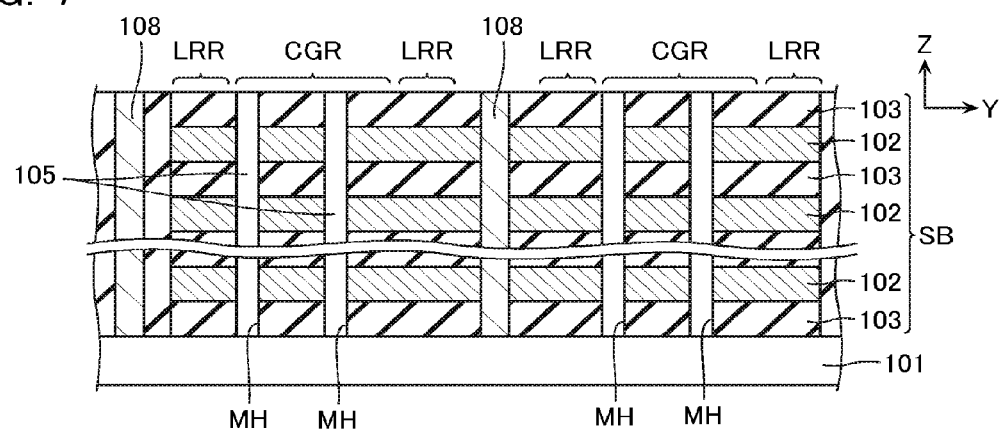
FIG. 7 is a cross-sectional view showing a configuration of part of the nonvolatile semiconductor memory device according to the first embodiment.
Figure 8:
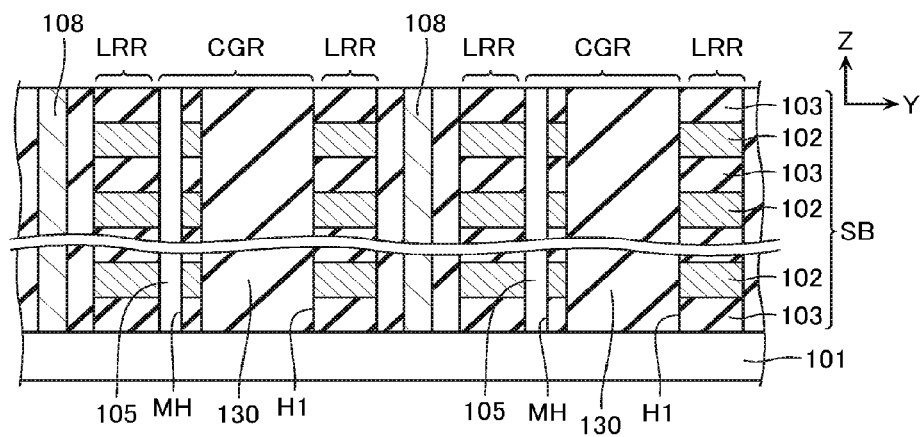
FIG. 8 is a cross-sectional view showing a configuration of part of the nonvolatile semiconductor memory device according to the first embodiment.

Next, the nonvolatile semiconductor memory device according to the present embodiment will be described in more detail with reference to FIGS. 5 to 8. FIG. 5 is a plan view showing a configuration of the nonvolatile semiconductor memory device of the first embodiment. FIG. 6 is a cross-sectional view showing the configuration of the nonvolatile semiconductor memory device of the first embodiment, and shows a cross-section taken along the line AA of FIG. 5. FIG. 7 is a cross-sectional view showing the configuration of the nonvolatile semiconductor memory device of the first embodiment, and shows a cross-section taken along the line BB of FIG. 5. FIG. 8 is a cross-sectional view showing the configuration of the nonvolatile semiconductor memory device of the first embodiment, and shows a cross-section taken along the line CC of FIG. 5.

As shown in FIG. 5, in the nonvolatile semiconductor memory device according to the present embodiment, a plurality of the conductive layers 102 (stacked bodies) having the X direction as their longitudinal direction, are arranged in the Y direction. Moreover, the conductive layer 108 (source contact LI) is provided between the conductive layers 102 (stacked bodies) adjacent in the Y direction, via an unillustrated inter-layer insulating layer. Note that the conductive layer 108 is connected to the source line SL via a source contact SC.

As shown in FIG. 5, a low resistance region LRR extending in the X direction is provided with a certain width at ends on both sides in the Y direction (side surfaces in an up/down direction in FIG. 5) of the conductive layer 102. Furthermore, a control gate region CGR is provided between a pair of the low resistance regions LRR. Now, a plurality of memory holes MH (memory columnar bodies 105) are provided in the control gate region CGR. In other words, the conductive layer 102 of the control gate region CGR is disposed so as to face the memory columnar body 105. Furthermore, the through hole H1 is provided in the control gate region CGR. A structure and operation of this through hole H1 will be mentioned later.

On the other hand, the low resistance region LRR is provided having the X direction as its longitudinal direction, and this low resistance region LRR is not provided with either the memory hole MH or the through hole H1. Therefore, an electrical resistance value of the low resistance region LRR is lower compared to an electrical resistance value in the control gate region CGR. This low resistance region LRR has a role of lowering a resistance value of the conductive layer 102 functioning as the word line WL, and thereby lowering power consumption of the nonvolatile semiconductor memory device. The low resistance region LRR is preferably present with a certain width on both left and right sides of one conductive layer 102, but it is also possible for it to be made present only on one of the left and right sides.

As shown in FIGS. 6 to 8, the memory hole MH and the through hole H1 are through holes that penetrate a stacked body SB of a plurality of the conductive layers 102 and inter-layer insulating layers 103, in the Z direction, from a surface of the stacked body SB. Regarding the number of through holes H1, one through hole H1 may be provided in one conductive layer 102, or two or more through holes H1 may be provided in one conductive layer 102. Moreover, a shape of one conductive layer 102 is not limited to an oval shape of the kind illustrated, and may be a rectangle, and so on.

As shown in FIGS. 6 and 7, the inside of the memory hole MH is provided with the memory columnar body 105. Moreover, the through hole H1 is implanted with a buckling suppression layer 130 configured from an insulating film of the likes of a silicon oxide film, for example, as required. The buckling suppression layer 130 has its both sides in the X direction and the Y direction surrounded by the stacked body SB configured from the plurality of conductive layers 102 and inter-layer insulating layers 103. The buckling suppression layer 130 is provided so as to extend along the Z direction from the surface of the stacked body SB toward the substrate 101.

As shown in FIG. 5, the memory holes MH and the memory columnar bodies 105 may be disposed staggered in the conductive layer 102. That is, the plurality of memory holes MH may be disposed so as to be aligned in a plurality of columns in an oblique direction intersecting both the X direction and the Y direction. Moreover, the conductive layers 106 that will be the bit lines BL are arranged having the Y direction as their longitudinal direction, with a certain pitch in the X direction, above these memory holes MH (memory columnar bodies 105) disposed staggered.

The memory columnar body 105 is connected to the conductive layer 106 (bit line BL) running above the memory columnar body 105, via a contact BC. Note that for simplification of illustration in FIG. 5, only four of the plurality of conductive layers 106 are representatively illustrated.

On the other hand, the through hole H1 is provided so as to intersect the longitudinal direction (X direction) of one conductive layer 102 in an oblique direction (refer to FIG. 5). This through hole H1 is a through hole formed so as to extend through the stacked body SB of the conductive layers 102 and inter-layer insulating layers 103, in a direction of the substrate, from the surface of the stacked body SB. The through hole H1, along with the buckling suppression layer 130 filled inside it, function as a slit portion that divides part of the stacked body SB of the conductive layers 102 and inter-layer insulating layers 103 in the X direction. As a result of the through hole H1 extending in a direction intersecting the X direction to divide the conductive layer 102 in the X direction, a warping amount of the substrate 101 and the stacked body SB of the conductive layers 102 and inter-layer insulating layers 103 is reduced. Note that advantages of reducing the warping amount of the substrate 101, and so on, may also be obtained by configuring the through hole H1 unchanged as a cavity. Therefore, it is also possible to configure the through hole H1 as a slit portion left unchanged as a cavity, without the buckling suppression layer 130 being implanted therein.

Now, details of the shape of the through hole H1 will be described.

Although it is sufficient for the through hole H1 to extend having as its longitudinal direction a direction intersecting the X direction, in this first embodiment, the through hole H1 is formed having an oblique direction as its longitudinal direction with respect to the X direction. A tilt angle α with respect to the X direction of the longitudinal direction of the through hole H1 is not limited to a specific one. However, as shown in FIG. 5, in the case where the memory holes MH are disposed staggered, it is preferable to substantially match the tilt angle α to a tilt angle with respect to the X direction of a direction in which the memory holes MH are arranged.

Moreover, as illustrated as an example in FIG. 5, for example, a width W in the longitudinal direction of the through hole H1 is set to several times, for example, about six to seven times a width (diameter) D of the memory hole MH. However, the width W of the through hole H1 is not restricted to a specific relationship in relation to the width D of the memory hole MH. It is enough for the through hole H1 to extend so as to divide at least part of the conductive layer 102 in the Y direction which is a transverse direction of the conductive layer 102. However, in order to suppress the increment of the resistance value of the conductive layer 102, the through hole H1 is preferably formed within a range of the control gate region CGR, and preferably does not have its end protruding to a low resistance region LRR side. However, the end of the through hole H1 may protrude to the low resistance region LRR side in a range not substantively raising a resistance value of the low resistance region LRR.

Moreover, regarding a position in the conductive layer 102 of the through hole H1, it is preferable that a gravity center of the through hole H1 substantially matches a center line c1 extending in the X direction of the conductive layer 102. Note that a ratio of widths in the Y direction of the control gate region CGR and the low resistance region LRR in one conductive layer 102 is determined according to a required resistance value of the conductive layer 102.

[Method of Manufacturing]

Next, a method of manufacturing a nonvolatile semiconductor memory device according to the first embodiment will be described with reference to FIGS. 9 to 27.

Figure 9:
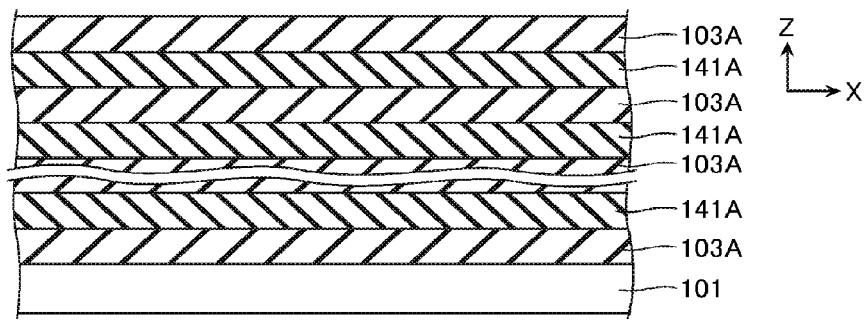
FIGS. 9 to 27 are cross-sectional views showing manufacturing steps of the nonvolatile semiconductor memory device according to the first embodiment.
Figure 10:
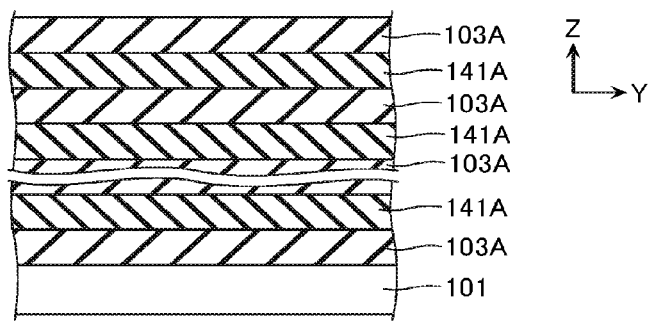

First, as shown in FIGS. 9 and 10, in the method of manufacturing according to the present embodiment, a plurality of sacrifice layers 141A and inter-layer insulating layers 103A are stacked alternately on the substrate 101. The inter-layer insulating layer 103A will be the inter-layer insulating layer 103. Note that the inter-layer insulating layer 103A is configured from, for example, silicon oxide ($SiO_2$). Moreover, the sacrifice layer 141A is configured from, for example, silicon nitride (SiN).

Figure 11:
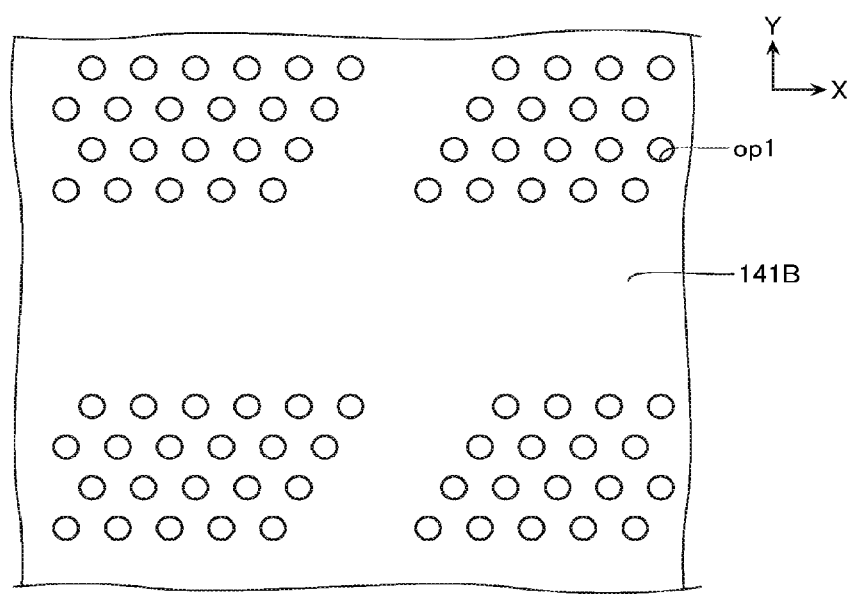
Figure 12:
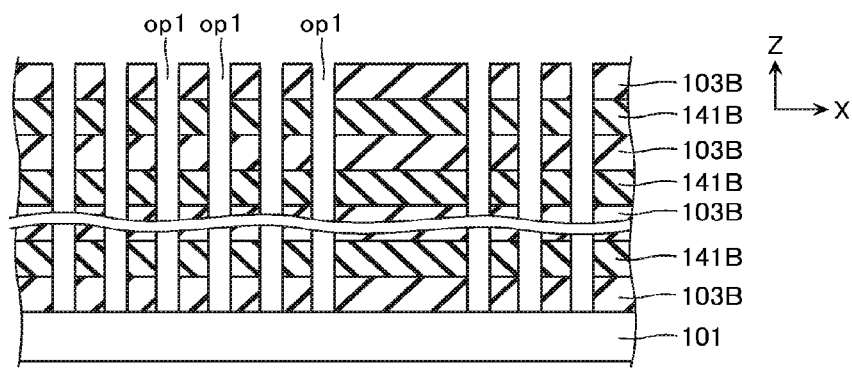
Figure 13:
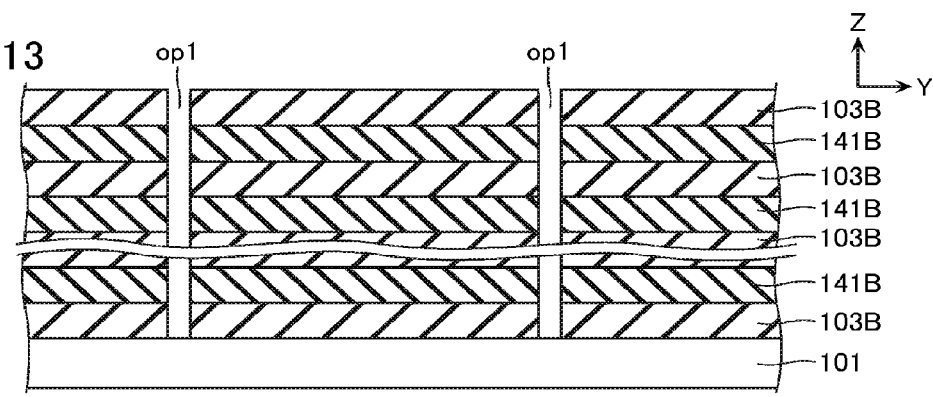

Next, as shown in FIGS. 11 to 13, an opening op1 penetrating the inter-layer insulating layer 103A and the sacrifice layer 141A is formed, and when the opening op1 has been provided, an inter-layer insulating layer 103B and a sacrifice layer 141B are formed. Note that the opening op1 will be the previously mentioned memory hole MH.

Figure 14:
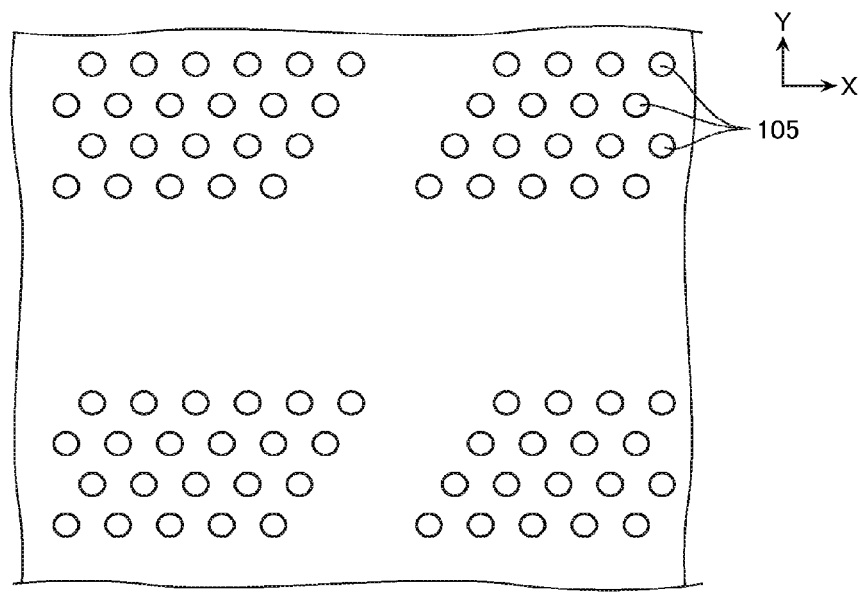
Figure 15:
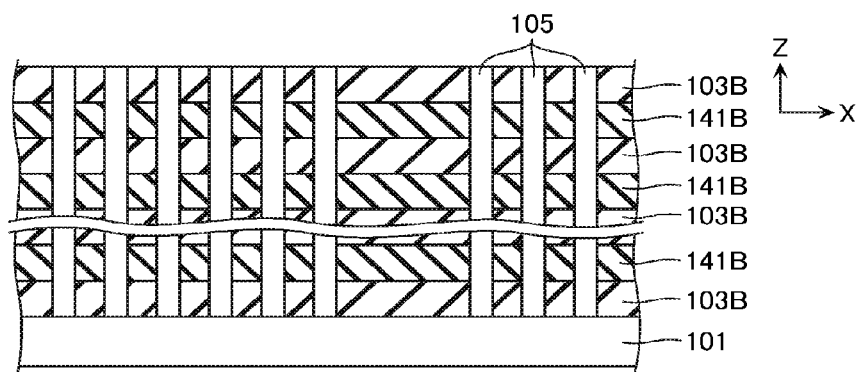
Figure 16:
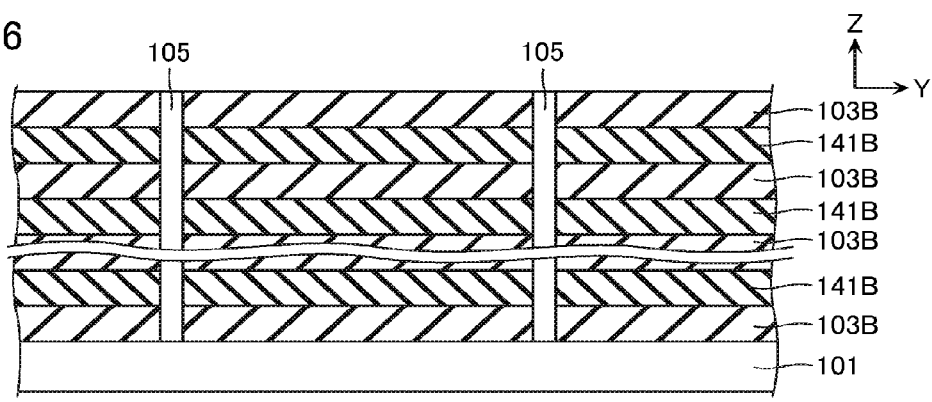

Next, as shown in FIGS. 14 to 16, the memory columnar body 105 is formed inside the opening op1. Specifically, for example, the charge accumulation layer 124, the tunnel insulating layer 123, and the semiconductor layer 122 already described with reference to FIG. 4 are formed on an inner wall of the opening op1, and the core insulating layer 121 is implanted therein.

Figure 17:
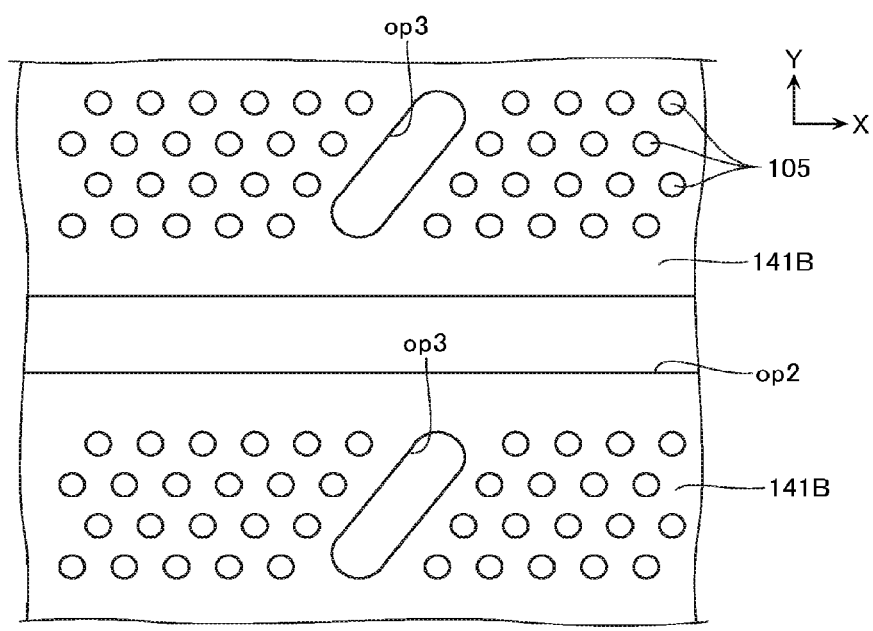
Figure 18:
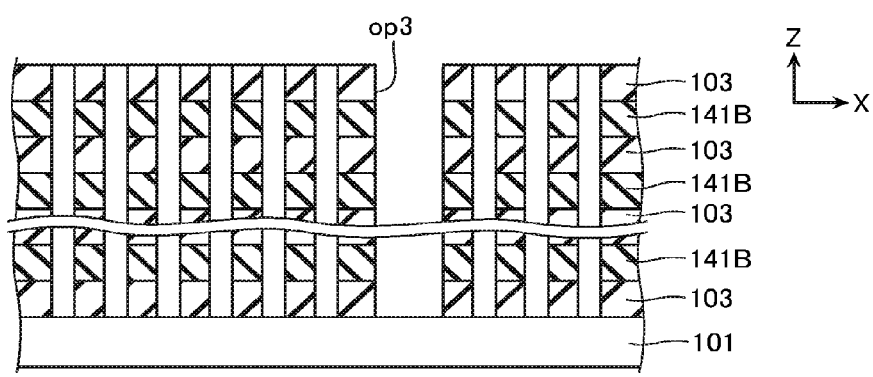
Figure 19:
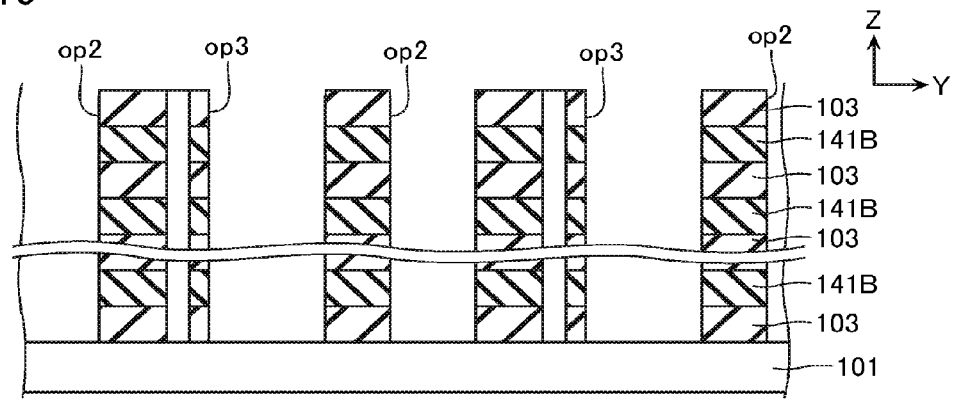

Next, as shown in FIGS. 17 to 19, openings op2 and op3 penetrating a stacked body of the inter-layer insulating layers 103B and sacrifice layers 141B are formed. The opening op2 is a hole having the X direction as its longitudinal direction that divides the stacked body of the inter-layer insulating layers 103B and sacrifice layers 141B with a certain spacing in the Y direction and forms the plurality of conductive layers 102 having the X direction as their longitudinal direction. On the other hand, as shown in FIG. 17, the opening op3 is formed so as to extend in an oblique direction to the X direction and the Y direction and thereby divide a region where the memory columnar body 105 is formed (control gate region CGR) in the X direction. This opening op3 will be the previously mentioned through hole H1.

Figure 20:
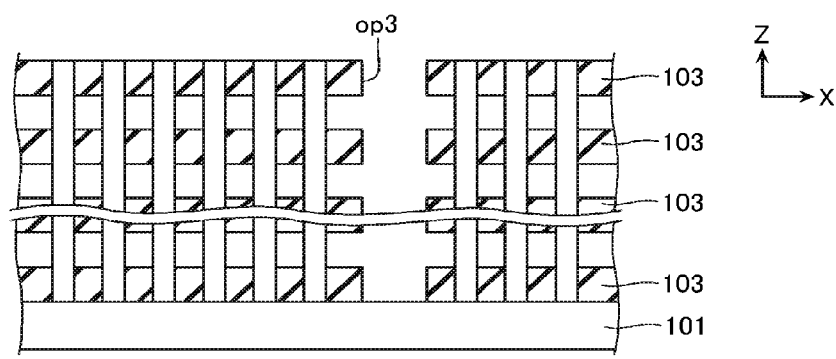
Figure 21:
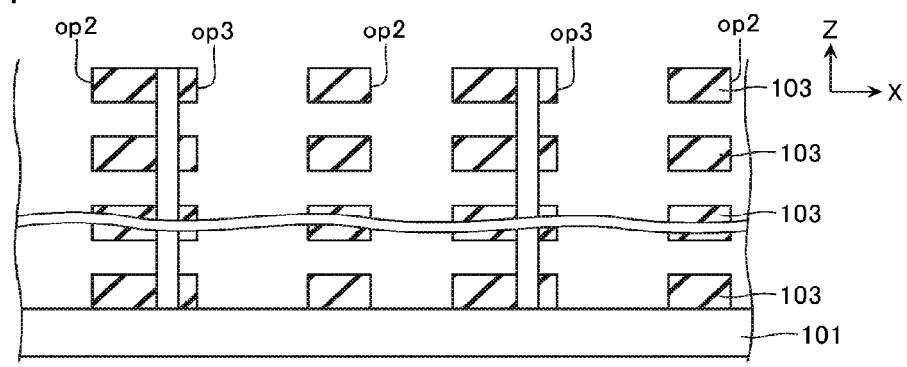

Next, as shown in FIGS. 20 and 21, the sacrifice layer 141B is removed by performing wet etching via the openings op2 and op3 thus formed.

Figure 22:
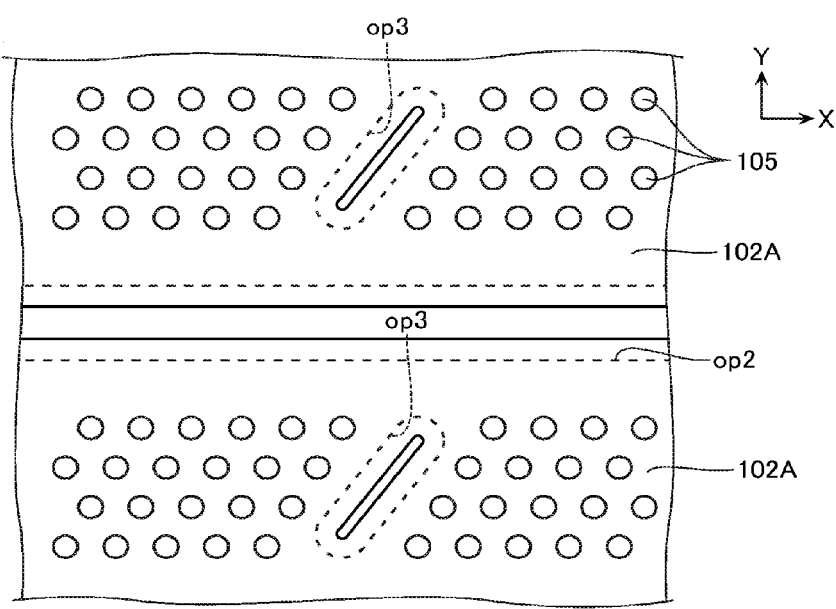
Figure 23:
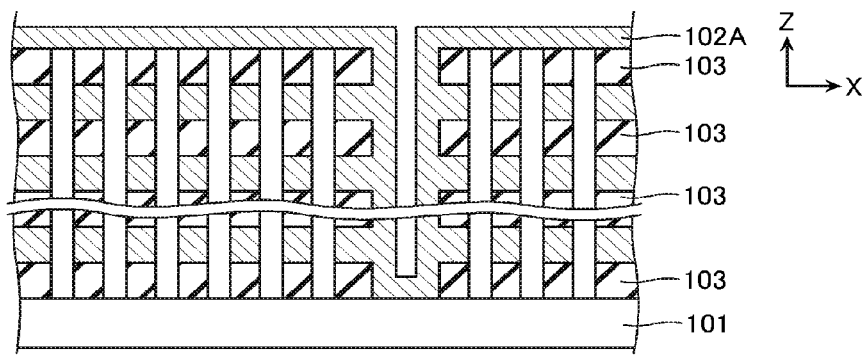
Figure 24:
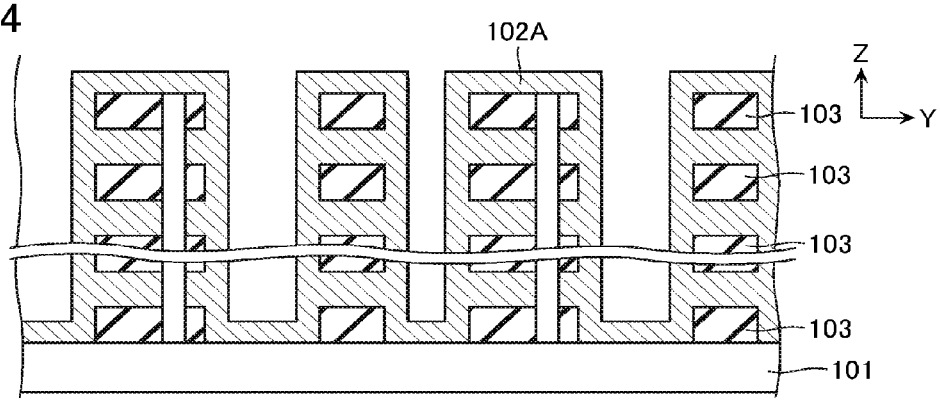

Next, as shown in FIGS. 22 to 24, a CVD method is executed on an entire surface of the semiconductor substrate 101 including the openings op2 and op3 and a space where the sacrifice layer 141B was removed, thereby depositing the block insulating layer 125 and a conductive layer formation layer 102A in that order (illustration of the block insulating layer 125 is omitted). The conductive layer formation layer 102A is a layer that will be the previously mentioned conductive layer 102, and is deposited adopting the likes of tungsten (W), for example, as its material.

Figure 25:
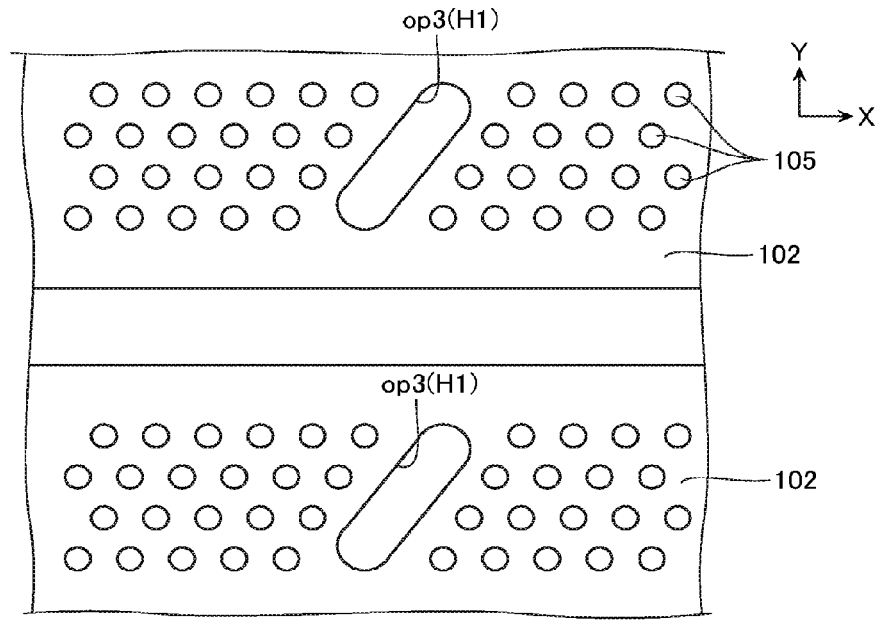
Figure 26:
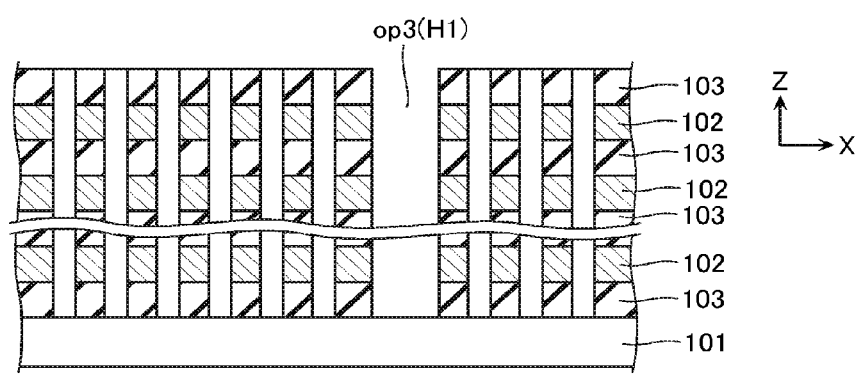
Figure 27:
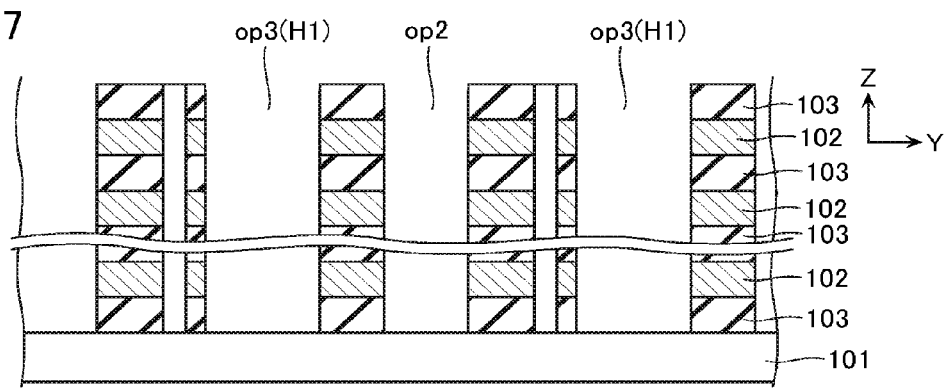

Then, as shown in FIGS. 25 to 27, the conductive layer formation layer 102A formed on sidewalls of the openings op2 and op3 and on a surface of the uppermost layer inter-layer insulating layer 103, is removed by anisotropic etching. As a result, the conductive layer formation layer 102A is divided in an up/down direction by the inter-layer insulating layer 103, and becomes the previously mentioned conductive layer 102. Moreover, the opening op3 becomes the previously mentioned through hole H1. Finally, an insulating film such as a silicon oxide film is implanted in this through hole H1 using the likes of a CVD method to form the buckling suppression layer 130, whereby the stacked structure shown in FIGS. 5 to 8 is completed. Furthermore, the bit line contact BC is formed on the memory columnar body 105, the source line contact SC is formed on the conductive layer 108, and the bit line BL, source line SL, and so on, are formed in a layer above these contacts. As a result, the nonvolatile semiconductor memory device according to the present embodiment is manufactured.

Next, advantages of the nonvolatile semiconductor memory device of this first embodiment will be described with reference to FIGS. 28 and 29.

Figure 28:
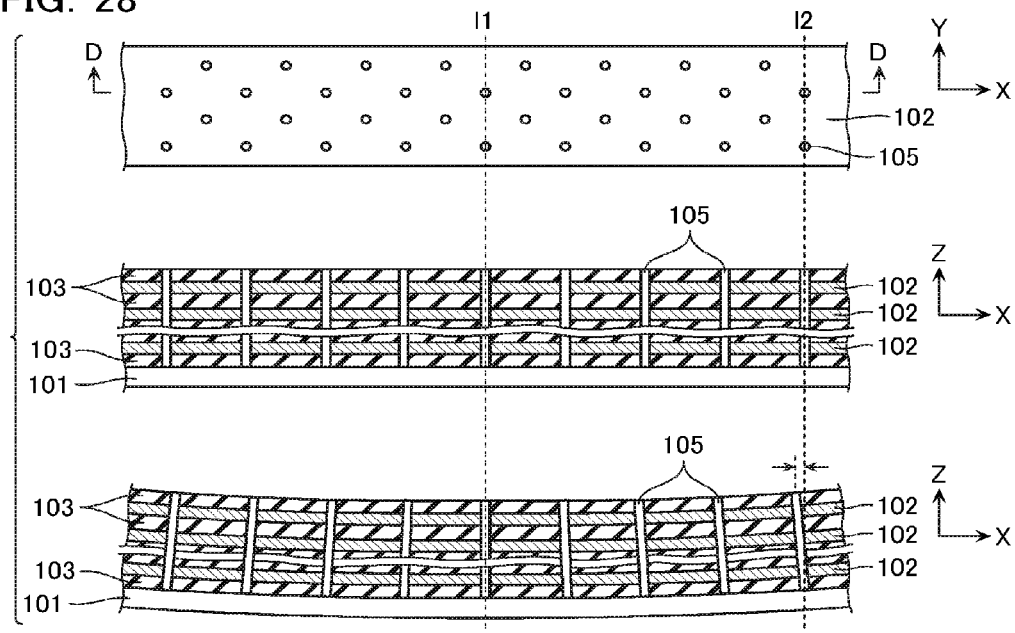
FIGS. 28 and 29 explain advantages of the first embodiment.

FIG. 28 explains the case where the through hole H1 is not present in the conductive layer 102. In this example of FIG. 28, in the case where the conductive layer 102 configured from tungsten, for example, has caused stress in its deposition process, the substrate 101 as a whole gets warped because there is no through hole H1.

Figure 29:
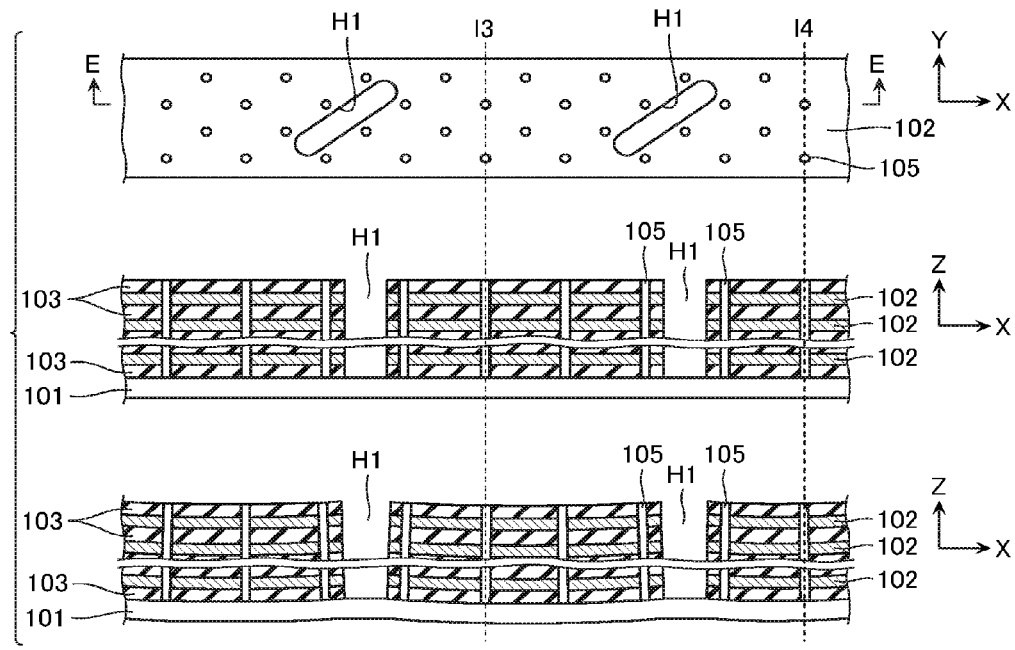

On the other hand, FIG. 29 explains the case where the through hole H1 is present in the conductive layer 102. In this example of FIG. 29, even in the case where the conductive layer 102 configured from tungsten, for example, has caused stress in its deposition process, the conductive layer 102 is divided into a plurality in the X direction by the through hole H1. Therefore, even if warping has been caused in the substrate 101, this is confined to part of the substrate 101. Moreover, warping in a small stacked body divided by the through hole H1 is extremely small compared to warping in a large stacked body not divided by the through hole H1 of the kind of FIG. 28. Therefore, a risk of positional misalignment occurring in formation of the upper layer wiring line, and so on, is reduced. Thus, as described above, the nonvolatile semiconductor memory device of this first embodiment results in the warping amount of the substrate 101 and the stacked body SB of the conductive layers 102 and inter-layer insulating layers 103 being reduced by action of the slit portion configured from the through hole H1.

Second Embodiment

Figure 30:
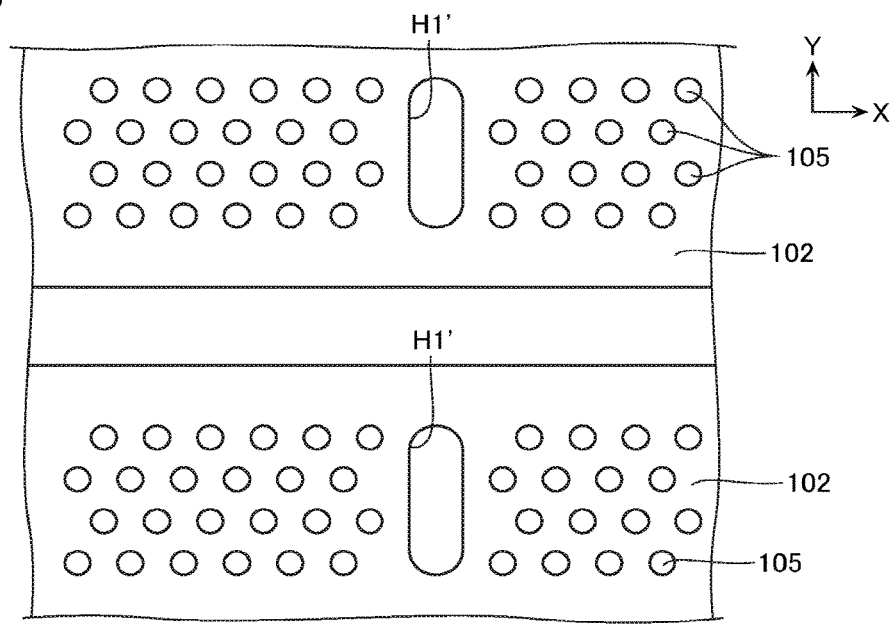
FIG. 30 is a plan view showing a configuration of part of a nonvolatile semiconductor memory device according to a second embodiment.

Next, a configuration of a nonvolatile semiconductor memory device according to a second embodiment will be described with reference to FIG. 30. FIG. 30 is a plan view showing the configuration of the nonvolatile semiconductor memory device of the second embodiment. An overall configuration of the nonvolatile semiconductor memory device of this second embodiment is identical to that of the first embodiment (FIGS. 1 to 4), hence a duplicated description thereof will be omitted. However, as shown in FIG. 30, in this second embodiment, a shape of a through hole H1' is different from that in the first embodiment. In FIG. 30, portions similar to those of the first embodiment are assigned with identical reference symbols to those assigned in the first embodiment, and descriptions thereof will be omitted. Note that in FIG. 30, illustration of the bit line BL and the source line SL is omitted.

As shown in FIG. 30, the nonvolatile semiconductor memory device according to the second embodiment has a through hole H1' formed having a substantially perpendicular direction to the X direction as its longitudinal direction. This differs from the through hole H1 being formed having an oblique direction to the X direction as its longitudinal direction in the first embodiment. In other respects, the second embodiment is identical to the first embodiment. This through hole H1' also has its inside implanted with the buckling suppression layer 130 configured from a silicon oxide film, for example, as required. A position, shape, and so on, of the through hole H1' may be changed similarly to in the case of the through hole H1.

This second embodiment also enables substantially identical advantages to those of the first embodiment to be displayed.

Third Embodiment

Figure 31:
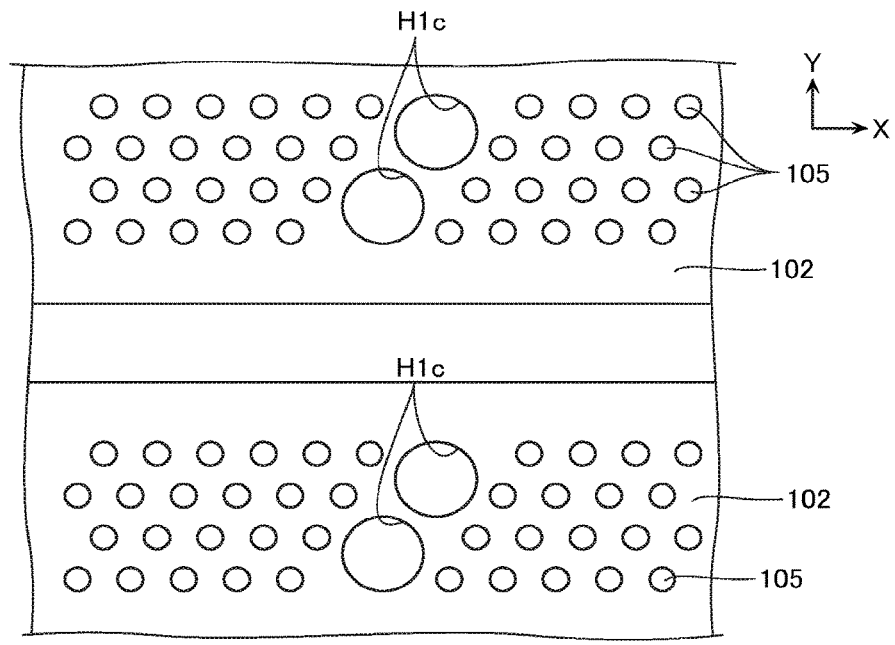
FIG. 31 is a plan view showing a configuration of part of a nonvolatile semiconductor memory device according to a third embodiment.

Next, a configuration of a nonvolatile semiconductor memory device according to a third embodiment will be described with reference to FIG. 31. FIG. 31 is a plan view showing the configuration of the nonvolatile semiconductor memory device of the third embodiment. An overall configuration of the nonvolatile semiconductor memory device of this third embodiment is identical to that of the first embodiment (FIGS. 1 to 4), hence a duplicated description thereof will be omitted. However, as shown in FIG. 31, in this third embodiment, a shape of a through hole H1c is different from that in the first embodiment. In FIG. 31, portions similar to those of the first embodiment are assigned with identical reference symbols to those assigned in the first embodiment, and descriptions thereof will be omitted. Note that in FIG. 31, illustration of the bit line BL and the source line SL is omitted.

As shown in FIG. 31, the nonvolatile semiconductor memory device according to the third embodiment has two circular through holes H1c formed so as to be aligned along an oblique direction to the X direction. One conductive layer 102 is divided in the X direction by these two through holes H1c. Whereas in the previously mentioned embodiments, one conductive layer 102 is divided into a plurality in the X direction by one through hole H1 or H1', in this third embodiment, one conductive layer 102 is divided in the X direction by a plurality of (in the illustrated example, two) through holes H1c. Note that the shape of the through hole H1c is not limited to a circle, and may also be configured as an ellipse, a rectangle, and so on.

This third embodiment also enables substantially identical advantages to those of the first embodiment to be displayed.

Fourth Embodiment

Figure 32:
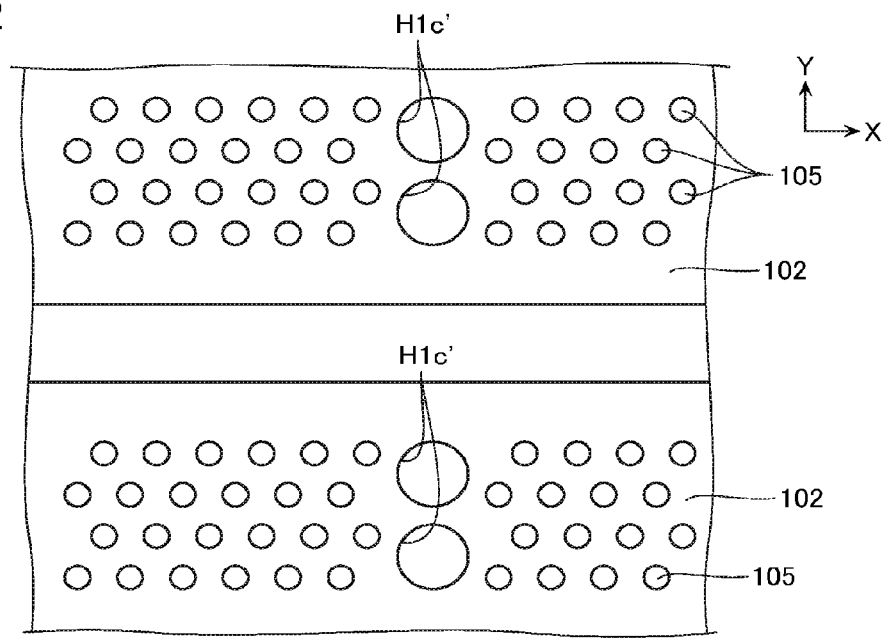
FIG. 32 is a plan view showing a configuration of part of a nonvolatile semiconductor memory device according to a fourth embodiment.

Next, a configuration of a nonvolatile semiconductor memory device according to a fourth embodiment will be described with reference to FIG. 32. FIG. 32 is a plan view showing the configuration of the nonvolatile semiconductor memory device of the fourth embodiment. An overall configuration of the nonvolatile semiconductor memory device of this fourth embodiment is identical to that of the first embodiment (FIGS. 1 to 4), hence a duplicated description thereof will be omitted. However, as shown in FIG. 32, in this fourth embodiment, a shape of a through hole H1c' is different from that in the first embodiment. In FIG. 32, portions similar to those of the first embodiment are assigned with identical reference symbols to those assigned in the first embodiment, and descriptions thereof will be omitted. Note that in FIG. 32, illustration of the bit line BL and the source line SL is omitted.

As shown in FIG. 32, the nonvolatile semiconductor memory device according to the fourth embodiment has two circular through holes H1c' formed so as to be aligned along a substantially perpendicular direction to the X direction. One conductive layer 102 is divided in the X direction by these two through holes H1c'. Whereas in the previously mentioned embodiments, one conductive layer 102 is divided by one through hole H1 or H1', in this fourth embodiment, the conductive layer 102 is divided in the X direction by a plurality of (in the illustrated example, two) through holes H1c'. Note that the shape of the through hole H1c' is not limited to a circle, and may also be configured as an ellipse, a rectangle, and so on.

This fourth embodiment also enables substantially identical advantages to those of the first embodiment to be displayed.

Fifth Embodiment

Figure 33:
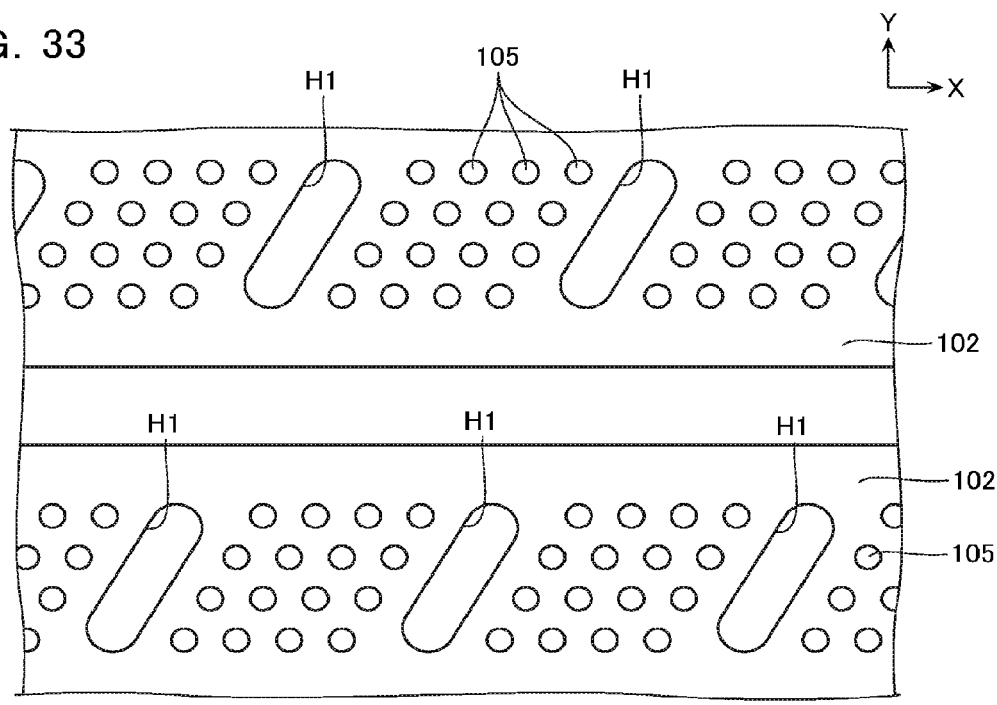
FIG. 33 is a plan view showing a configuration of part of a nonvolatile semiconductor memory device according to a fifth embodiment.

Next, a configuration of a nonvolatile semiconductor memory device according to a fifth embodiment will be described with reference to FIG. 33. FIG. 33 is a plan view showing the configuration of the nonvolatile semiconductor memory device of the fifth embodiment. An overall configuration of the nonvolatile semiconductor memory device of this fifth embodiment is identical to that of the first embodiment (FIGS. 1 to 4), hence a duplicated description thereof will be omitted. However, as shown in FIG. 33, in this fifth embodiment, an arrangement of the through holes H1 is different from that in the first embodiment. In FIG. 33, portions similar to those of the first embodiment are assigned with identical reference symbols to those assigned in the first embodiment, and descriptions thereof will be omitted. Note that in FIG. 33, illustration of the bit line BL and the source line SL is omitted.

As shown in FIG. 33, the nonvolatile semiconductor memory device according to the fifth embodiment has a position in the X direction of the through hole H1 differing among the plurality of conductive layers 102, and this is different from the previously mentioned embodiments. In FIG. 33, a formation position of the through hole H1 in a certain conductive layer 102 (stacked body) is different from a formation position of the through hole H1 in another conductive layer 102 (stacked body) adjacent in the Y direction. Note that in FIG. 33, the through hole H1 having an oblique direction to the X direction as its longitudinal direction has been illustrated, but instead of this, the through hole H1' having a substantially perpendicular direction to the X direction as its longitudinal direction may be provided, or the plurality of circular through holes H1c may be provided. In either case, formation positions of the through holes in two conductive layers 102 (stacked bodies) adjacent in the Y direction are different.

The through hole of this fifth embodiment may also have its inside implanted with the buckling suppression layer 130 configured from a silicon oxide film, for example, as required.

This fifth embodiment also enables substantially identical advantages to those of the first embodiment to be displayed.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of stacked bodies including a plurality of control gate electrodes stacked above a substrate, the plurality of stacked bodies having their longitudinal direction in a first direction parallel to the substrate and being arranged in a second direction intersecting the first direction;
a semiconductor layer having one end thereof connected to the substrate, the semiconductor layer facing the plurality of control gate electrodes;
a charge accumulation layer positioned between the control gate electrode and the semiconductor layer; and
a slit portion extending in a direction of the substrate from a surface of the stacked body, wherein
the slit portion has its longitudinal direction in a direction intersecting the first direction.

2. The semiconductor memory device according to claim 1, wherein
the slit portion has its longitudinal direction in an oblique direction to the first direction.

3. The semiconductor memory device according to claim 1, wherein
the slit portion has its longitudinal direction in a substantially perpendicular direction to the first direction.

4. The semiconductor memory device according to claim 1, wherein
the semiconductor layer is disposed having as its longitudinal direction a stacking direction in which the plurality of control gate electrodes are stacked.

5. The semiconductor memory device according to claim 1, wherein
the semiconductor layer is disposed along a third direction intersecting the first direction, and
the slit portion has its longitudinal direction in the third direction.

6. The semiconductor memory device according to claim 1, wherein
the slit portion is a cavity portion disposed so as to extend in a stacking direction of the stacked body.

7. The semiconductor memory device according to claim 1, wherein
the slit portion is an insulating layer disposed so as to extend in a stacking direction of the stacked body.

8. The semiconductor memory device according to claim 1, wherein
the stacked body has an inter-layer insulating film sandwiched between the plurality of control gate electrodes, and the control gate electrode includes a metal film.

9. The semiconductor memory device according to claim 8, wherein
the slit portion has its longitudinal direction in a direction intersecting the first direction.

10. The semiconductor memory device according to claim 1, wherein
in each of the plurality of stacked bodies, the control gate electrode comprises: a first region having the first direction as its longitudinal direction and including the semiconductor layer; and
a second region adjacent in the second direction to the first region and not including the semiconductor layer.

11. The semiconductor memory device according to claim 10, wherein
the slit portion is formed in the first region.

12. A semiconductor memory device, comprising:
a plurality of stacked bodies including a plurality of control gate electrodes stacked above a substrate, the plurality of stacked bodies having their longitudinal direction in a first direction parallel to the substrate and being arranged in a second direction intersecting the first direction;
a semiconductor layer having one end thereof connected to the substrate, the semiconductor layer facing the plurality of control gate electrodes;
a charge accumulation layer positioned between the control gate electrode and the semiconductor layer; and
a plurality of slit portions extending in a direction of the substrate from a surface of the stacked body, wherein
the plurality of slit portions are disposed so as to be aligned in a direction intersecting the first direction.

13. A method of manufacturing a semiconductor memory device, comprising:
alternately stacking a plurality of inter-layer insulating layers and sacrifice layers above a substrate to form a stacked body;
forming a first through hole in the stacked body, the first through hole penetrating the stacked body;
forming a first semiconductor layer inside the first through hole, the first semiconductor layer facing the stacked body;
forming a second through hole in the stacked body, the second through hole penetrating the stacked body in a direction from a surface of the stacked body to the substrate and having longitudinal direction in a first direction parallel to the substrate, thereby dividing the stacked body;
removing the sacrifice layer via the second through hole; and
forming a conductive layer in a cavity portion after the sacrifice layer has been removed.

14. The method of manufacturing a semiconductor memory device according to claim 13, comprising
forming a third through hole in the stacked body, the third through hole penetrating the stacked body and having the first direction as its longitudinal direction.

15. The method of manufacturing a semiconductor memory device according to claim 13, comprising
implanting an insulating film in the second through hole.

16. The method of manufacturing a semiconductor memory device according to claim 13, wherein
the second through hole has its longitudinal direction in an oblique direction to the first direction.

17. The method of manufacturing a semiconductor memory device according to claim 13, wherein
the second through hole has its longitudinal direction in a substantially perpendicular direction to the first direction.

18. The method of manufacturing a semiconductor memory device according to claim 13, comprising
forming the second through hole so as to be aligned in a direction intersecting the first direction.

* * * * *